(12) United States Patent
Oka (10) Patent No.: US 12,243,728 B2
(45) Date of Patent: Mar. 4, 2025

(54) SUBSTRATE HOLDING METHOD AND SUBSTRATE PROCESSING APPARATUS

(71) Applicant: Tokyo Electron Limited, Tokyo (JP)

(72) Inventor: Shinsuke Oka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/629,113

(22) Filed: Apr. 8, 2024

(65) Prior Publication Data

US 2024/0258082 A1 Aug. 1, 2024

Related U.S. Application Data

(63) Continuation of application No. PCT/JP2022/042539, filed on Nov. 16, 2022.

(60) Provisional application No. 63/264,256, filed on Nov. 18, 2021.

(51) Int. Cl.
*H01J 37/32* (2006.01)

(52) U.S. Cl.
CPC .. *H01J 37/32715* (2013.01); *H01J 37/32091* (2013.01); *H01J 37/32743* (2013.01); *H01J 37/32899* (2013.01); *H01J 2237/24585* (2013.01); *H01J 2237/336* (2013.01)

(58) Field of Classification Search
CPC ........... H01J 37/32715; H01J 37/32091; H01J 37/32743; H01J 37/32899; H01J 2237/24585; H01J 2237/336
USPC ....................................................... 361/234
See application file for complete search history.

(56) References Cited

U.S. PATENT DOCUMENTS

| 2004/0053428 | A1* | 3/2004 | Steger ............... H01J 37/32642 438/10 |
| 2005/0042881 | A1* | 2/2005 | Nishimoto .......... H01L 21/6833 361/234 |
| 2013/0171336 | A1* | 7/2013 | Cheng .................... C23C 14/54 29/559 |

FOREIGN PATENT DOCUMENTS

| CN | 111048387 | 4/2020 |
| JP | 2005-191500 | 7/2005 |
| JP | 2013-162084 | 8/2013 |
| JP | 2018-006573 | 1/2018 |
| JP | 2020-061489 | 4/2020 |
| KR | 10-2020-0045672 | 5/2020 |
| KR | 20200045672 A | * 5/2020 |

* cited by examiner

*Primary Examiner* — Jared Fureman
*Assistant Examiner* — Nicolas Bellido
(74) *Attorney, Agent, or Firm* — IPUSA, PLLC

(57) ABSTRACT

A substrate holding method includes loading a first substrate into a first chamber and placing the first substrate on an electrostatic chuck disposed in the first chamber; applying a first voltage to an electrostatic electrode of the electrostatic chuck to attract the first substrate to the electrostatic chuck; unloading the electrostatic chuck from the first chamber; grinding a front surface of the electrostatic chuck; disposing the electrostatic chuck in a second chamber; placing the second substrate on the electrostatic chuck disposed in the second chamber; applying a second voltage smaller than the first voltage to the electrostatic electrode to attract the second substrate to the electrostatic chuck; and before the attracting of the second substrate, calculating a value of the second voltage by using a value of the first voltage and a value of a thickness of a dielectric of the electrostatic chuck disposed in the second chamber.

10 Claims, 8 Drawing Sheets

| INPUT INFORMATION | NEW PRODUCT | REDOT PRODUCT |
|---|---|---|
| REDOT PRODUCT OR NOT? | ○ | ○ |
| AVERAGE FILM THICKNESS $t_{ave\_i}$ OF NEW PRODUCT | ○ | ○ |
| AVERAGE FILM THICKNESS $t_{ave}$ OF REDOT PRODUCT | | ○ |
| IN-PLANE MINIMUM FILM THICKNESS $t_{min}$ OF REDOT PRODUCT | | ○ |
| DOT HEIGHT $t_{dot}$ | △ | △ |
| DIELECTRIC BREAKDOWN FILM THICKNESS $t_{bd}$ | △ | △ |
| BREAKDOWN MARGIN FILM THICKNESS $t_{mgn}$ | △ | △ |
| GRINDING AMOUNT SET VALUE $g_{ESC}$ | △ | △ |

SUBSTRATE HOLDING METHOD AND SUBSTRATE PROCESSING APPARATUS

CROSS-REFERENCE TO RELATED APPLICATIONS

This application is a continuation application of International Application No. PCT/JP2022/042539 filed on Nov. 16, 2022, and designating the U.S., which is based upon and claims priority to U.S. Provisional Application No. 63/264,256, filed on Nov. 18, 2021, the entire contents of which are incorporated herein by reference.

BACKGROUND

1. Technical Field

The present disclosure relates to a substrate holding method and a substrate processing apparatus.

2. Description of the Related Art

Patent Document 1 and Patent Document 2 disclose a method of restoring an electrostatic chuck by grinding a front surface of the electrostatic chuck to form a flat surface, and then forming columnar projection portions that support a substrate.

RELATED ART DOCUMENT

Patent Document

Patent Document 1: Japanese Laid-Open Patent Application Publication No. 2020-061489
Patent Document 2: Japanese Laid-Open Patent Application Publication No. 2013-162084

SUMMARY

According to one embodiment of the present disclosure, a substrate holding method includes loading a first substrate into a first chamber and placing the first substrate on an electrostatic chuck disposed in the first chamber; applying a first voltage to an electrostatic electrode of the electrostatic chuck to attract the first substrate to the electrostatic chuck; unloading the electrostatic chuck from the first chamber; grinding a front surface of the electrostatic chuck; disposing the electrostatic chuck in a second chamber; loading a second substrate into the second chamber and placing the second substrate on the electrostatic chuck disposed in the second chamber; applying a second voltage smaller than the first voltage to the electrostatic electrode of the electrostatic chuck to attract the second substrate to the electrostatic chuck; and before the attracting of the second substrate to the electrostatic chuck, calculating a value of the second voltage by using a value of the first voltage and a value of a thickness of a dielectric of the electrostatic chuck disposed in the second chamber.

DETAILED DESCRIPTION

Hereinafter, various exemplary embodiments will be described in detail with reference to the drawings. Further, the same reference numerals will be given to the same or corresponding parts throughout the drawings.

[Plasma Processing System]

Figure 1:
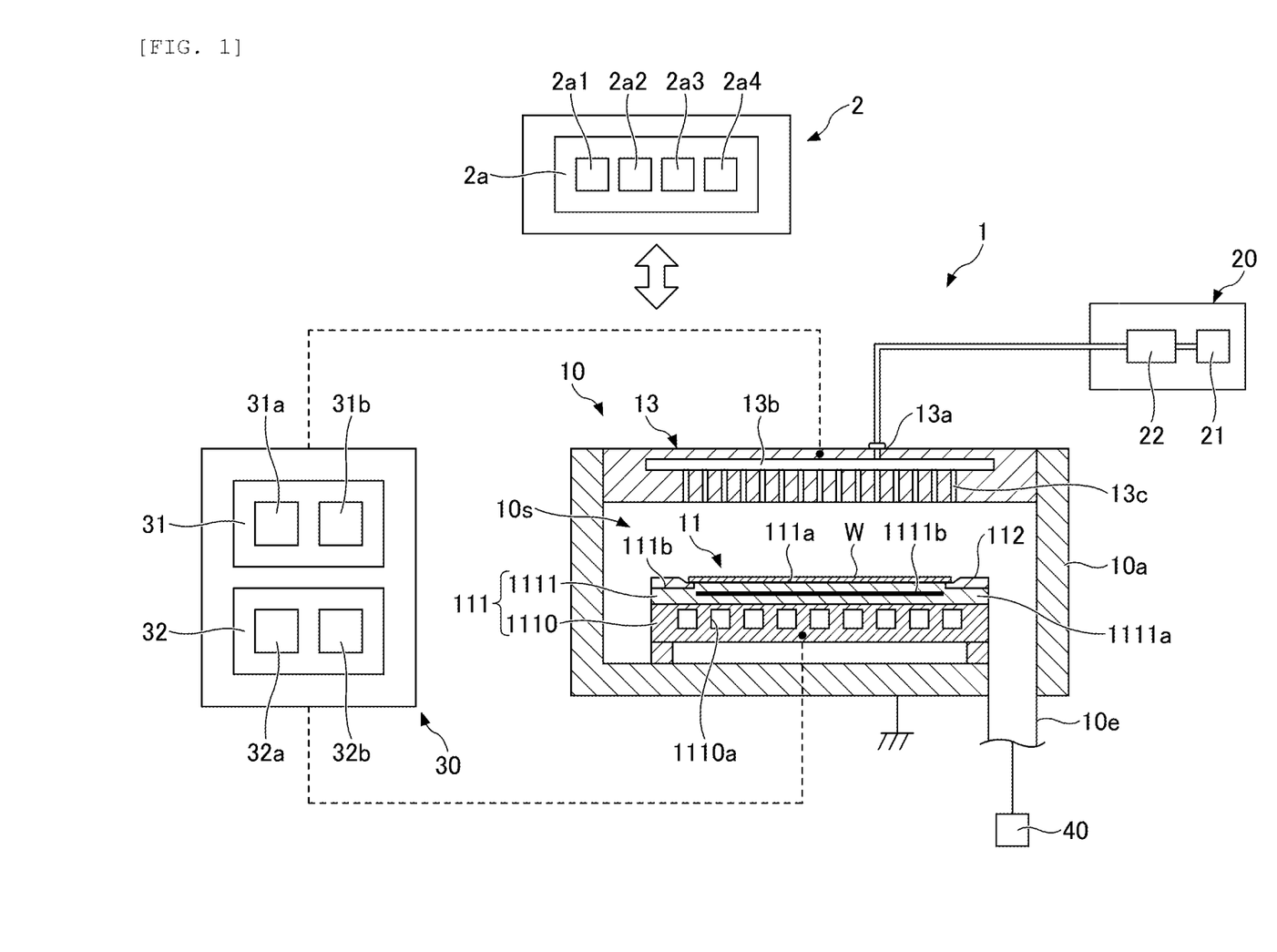
FIG. 1 is an example of a diagram illustrating a configuration example of a capacitively-coupled plasma processing apparatus.

Hereinafter, a configuration example of a plasma processing system will be described. FIG. 1 is an example of a diagram illustrating a configuration example of a capacitively-coupled plasma processing apparatus (a substrate processing apparatus) 1.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction section. The gas introduction section is configured to introduce at least one processing gas into the plasma processing chamber 10. The gas introduction section includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space 10s. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of the substrate W. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. Accordingly, the central region 111a is also referred to as a substrate support surface for supporting the substrate W, and the annular region 111b is also referred to as a ring support surface for supporting the ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In one embodiment, the ceramic member 1111a also has the annular region 111b. Other members that surround the electrostatic chuck 1111, such as an annular electrostatic chuck and an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31, a direct current (DC) power source 32, or both to be described below may be disposed inside the ceramic member 1111a. In this case, at least one RF/DC electrode functions as the lower electrode. In a case where a bias RF signal, a DC signal, or both to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111b may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, or the substrate W to a target temperature. The temperature control module may include a heater, a heat transfer medium, a flow path 1110a, or a combination thereof. A heat transfer fluid, such as brine or gas, flows through the flow path 1110a. In one embodiment, the flow path 1110a is formed inside the base 1110, and one or more heaters are disposed in the ceramic member 1111a of the electrostatic chuck 1111. Further, the substrate support 11 may include a heat transfer gas supply configured to supply a heat transfer gas to a gap between a rear surface of the substrate W and the central region 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction section may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power) to at least one lower electrode, at least one upper electrode, or both. As a result, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, supplying the bias RF signal to at least one lower electrode can generate a bias potential in the substrate W to attract an ionic component in the formed plasma to the substrate W.

In one embodiment, the RF power source 31 includes a first RF generator 31a and a second RF generator 31b. The first RF generator 31a is configured to be coupled to at least one lower electrode, at least one upper electrode, or both via at least one impedance matching circuit to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode, at least one upper electrode, or both.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. Further, in any of the various embodiments, at least one of the source RF signal or the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate a first DC signal. The generated first bias DC signal is applied to at least one lower electrode. In one embodiment, the second DC generator 32b is configured to be connected to at least one upper electrode to generate a second DC signal. The generated second DC signal is applied to at least one upper electrode.

In various embodiments, at least one of the first DC signal or the second DC signal may be pulsed. In this case, a sequence of voltage pulses is applied to at least one lower electrode, at least one upper electrode, or both. The voltage pulse may have a pulse waveform of a rectangle, a trapezoid, a triangle, or a combination thereof. In one embodiment, a waveform generator for generating a sequence of voltage pulses from the DC signal is connected between the first DC generator 32a and at least one lower electrode. Accordingly, the first DC generator 32a and the waveform generator configure a voltage pulse generator. In a case where the second DC generator 32b and the waveform generator configure a voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor 2a1, a storage unit 2a2, and a communication interface 2a3. The controller 2 is implemented by, for example, a computer 2a. The processor 2a1 may be configured to read a program from the storage unit 2a2 and perform various control operations by executing the read program. The program may be stored in advance in the storage unit 2a2, or may be acquired via a medium when necessary. The acquired program is stored in the storage unit 2a2, and is read from the storage unit 2a2 and executed by the processor 2a1. The medium may be various storing media readable by the computer 2a, or may be a communication line connected to the communication interface 2a3. Further, the storage unit 2a2 stores data (recipes) that include processing parameters necessary for substrate processing. Data such as a chuck voltage, a type of gas to be supplied, a gas flow rate, a magnitude (magnitude of the bias voltage) of the bias RF signal, the DC signal, or both, and a processing time are stored. The processor 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN). Further, the controller 2 may include a display unit (display) 2a4. The display unit 2a4 displays processing contents executed by the computer 2a, input contents to the computer 2a, data stored in the storage unit 2a2, or both.

[Restoration of Electrostatic Chuck 1111]

Figure 2:
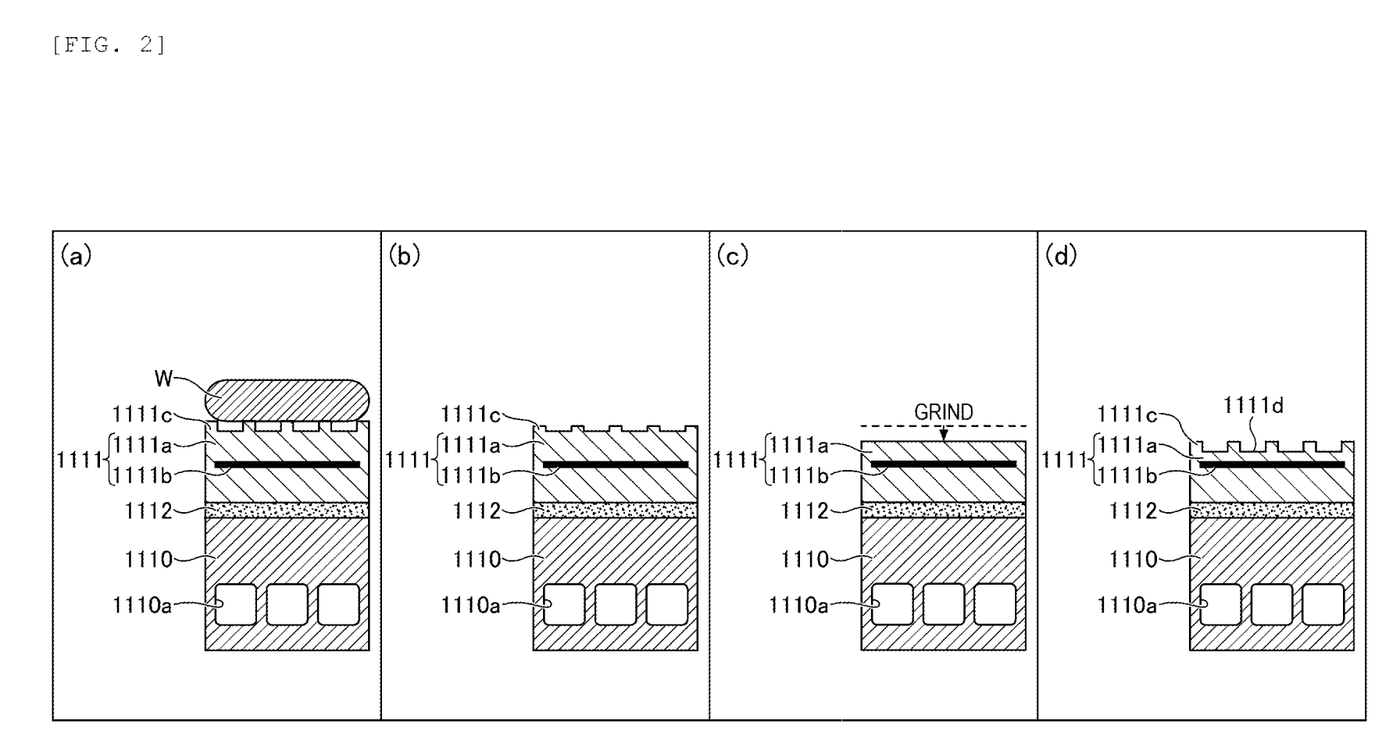
FIG. 2 is an example of a schematic cross-sectional view illustrating restoration of an electrostatic chuck.

Next, restoration of the electrostatic chuck 1111 will be described with reference to FIG. 2. FIG. 2 is an example of a schematic cross-sectional view illustrating the restoration of the electrostatic chuck 1111.

(a) of FIG. 2 is an example of a schematic cross-sectional view illustrating a state where the electrostatic chuck 1111 as a new product attracts the substrate W.

The electrostatic chuck 1111 includes the ceramic member 1111a, which is a dielectric, and the electrostatic electrode 1111b. A rear surface of the electrostatic chuck 1111 is detachably attached, via an adhesive 1112, to a front surface of the base 1110 including the flow path 1110a. Projection portions (dots) 1111c that support the substrate W are provided on a front surface of the electrostatic chuck 1111. The projection portions 1111c may include an annular portion and a plurality of columnar portions disposed inside the annular portion. The annular portion is an annular portion provided at an outer peripheral portion of the substrate support surface of the electrostatic chuck 1111. The columnar portion is a columnar portion disposed inside the annular portion in the plan view. The rear surface of the substrate W is supported to be in contact with upper surfaces of the projection portions 1111c. By applying a chuck voltage $V_{HV}$ to the electrostatic electrode 1111b, the substrate W is attracted by the electrostatic chuck 1111. A heat transfer gas is supplied into a space defined between the rear surface of the substrate W and the front surface of the electrostatic chuck 1111. A temperature of the substrate W is adjusted by supplying the heat transfer gas into the space.

(b) of FIG. 2 is an example of a schematic cross-sectional view illustrating a state of the electrostatic chuck 1111 after plasma processing.

When the electrostatic chuck 1111 is exposed to a process gas during waferless dry cleaning or the like, the front surface thereof may deteriorate and attraction performance may decrease. Further, when the projection portions 1111c are worn by, for example, waferless dry cleaning or contact with the rear surface of the substrate W, a volume of the space between the front surface of the electrostatic chuck 1111 and the rear surface of the substrate W is reduced. Accordingly, the temperature of the substrate W may differ between a state where the projection portions 1111c are not worn (see (a) of FIG. 2) and a state where the projection portions 1111c are worn (see (b) of FIG. 2), and the substrate W may not be processed uniformly. Further, when an etching process is performed as the plasma processing on the substrate W, etching characteristics may be changed.

Therefore, it is necessary to periodically replace the electrostatic chuck 1111 with a new product. However, because the electrostatic chuck 1111 is expensive, the front surface of the electrostatic chuck 1111 is also ground and reused.

(c) of FIG. 2 is an example of a schematic cross-sectional view illustrating a state of the electrostatic chuck 1111 after the grinding. By grinding the deteriorated front surface of the electrostatic chuck 1111 and the worn projection portions 1111c, a flat surface is formed on the front surface of the electrostatic chuck 1111.

(d) of FIG. 2 is an example of a schematic cross-sectional view illustrating a state of the electrostatic chuck 1111 after the projection portions 1111c are formed. By removing portions of the front surface of the electrostatic chuck 1111 to form recess portions 1111d, portions that are not removed are formed as the projection portions 1111c. For example, a mask corresponding to disposing of the projection portions 1111c is formed on the front surface of the electrostatic chuck 1111, and the recess portions 1111d are formed by performing blasting or the like through the mask. Then, portions covered with the mask are formed as the projection portions 1111c. Thereafter, the mask is removed.

In this way, the projection portions 1111c on the front surface of the electrostatic chuck 1111 are removed, and the projection portions 1111c are formed again, so that the electrostatic chuck 1111 is restored. In the following description, the restoration of the electrostatic chuck 1111 will also be referred to as a "redot". Further, the restored electrostatic chuck 1111 will also be referred to as a restored product or a redot product.

In restoration processing of the electrostatic chuck 1111, the electrostatic chuck 1111 together with the base 1110 may be removed from the plasma processing apparatus 1 and the front surface of the removed electrostatic chuck 1111 may be ground as illustrated in (c) of FIG. 2. Further, in the restoration processing of the electrostatic chuck 1111, the electrostatic chuck 1111 may be removed from the base 1110 and the front surface of the removed electrostatic chuck 1111 may be ground.

[Method of Adjusting Chuck Voltage]

Figure 3A:
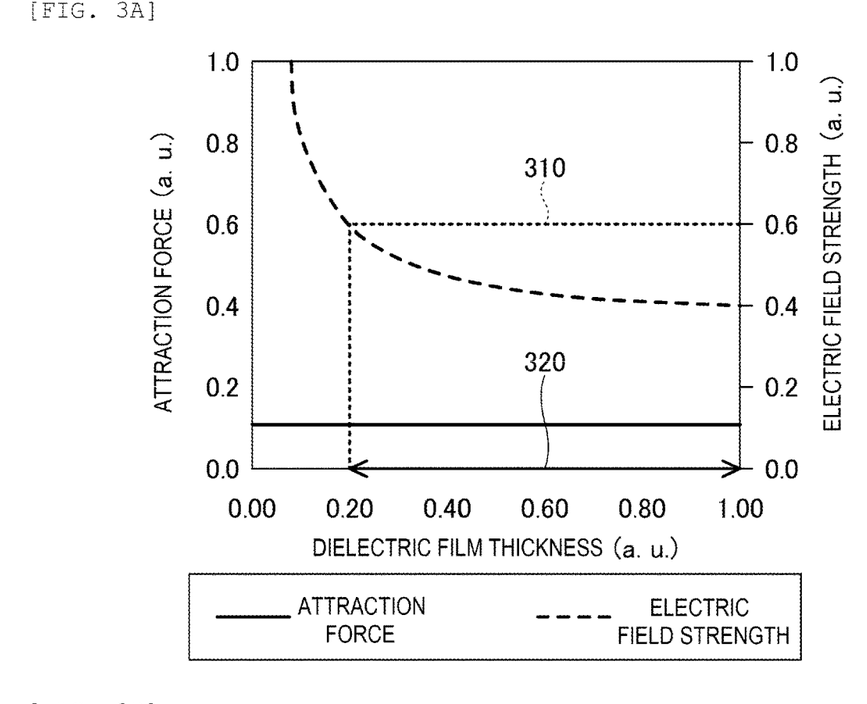
FIG. 3A and FIG. 3B are examples of a graph indicating a method of adjusting a chuck voltage in the present disclosure.
Figure 3B:
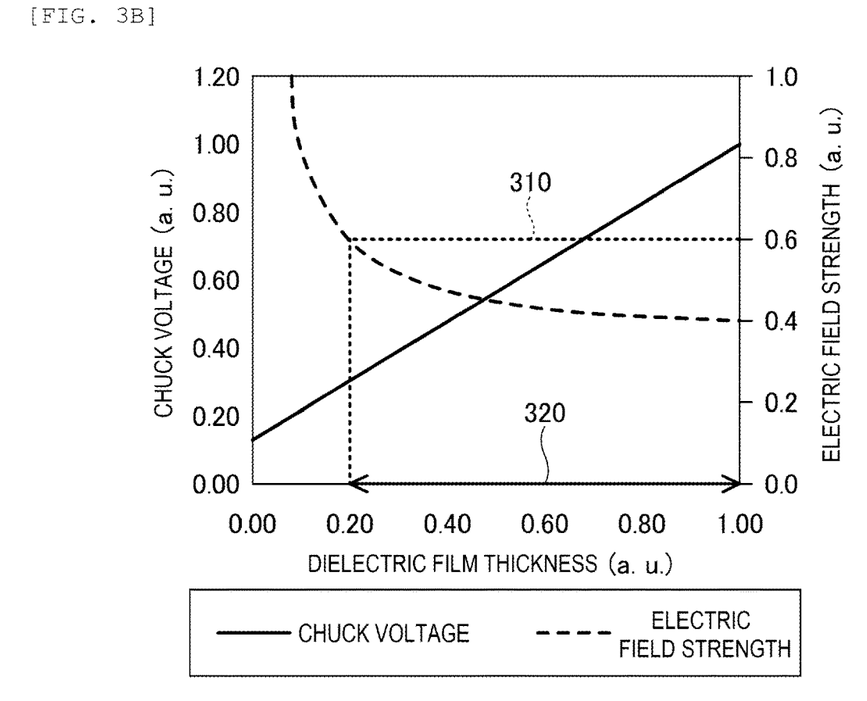
Figure 4A:
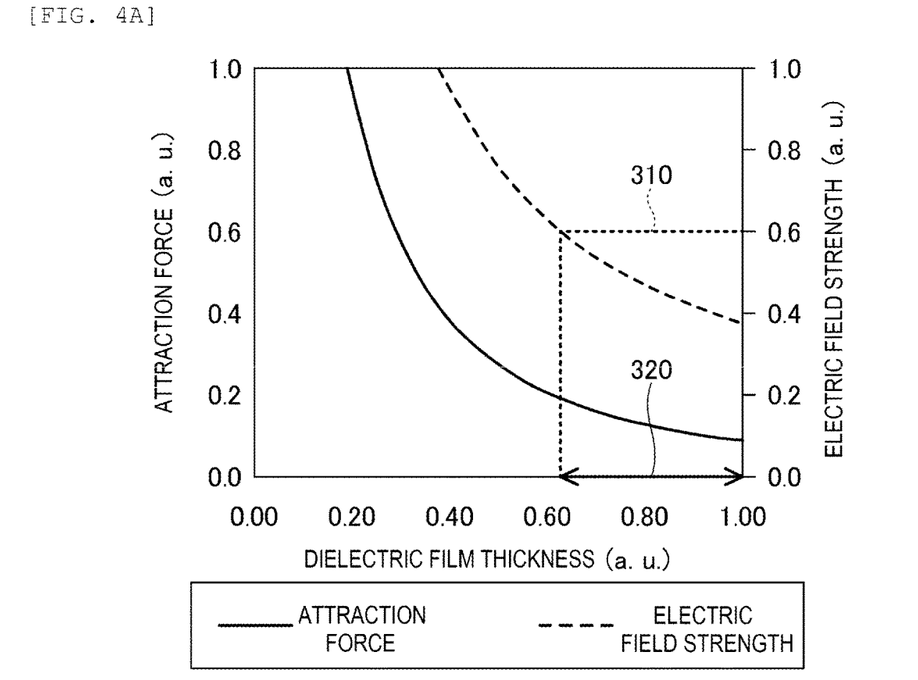
FIG. 4A and FIG. 4B are examples of a graph illustrating a method of adjusting a chuck voltage in a reference example.
Figure 4B:
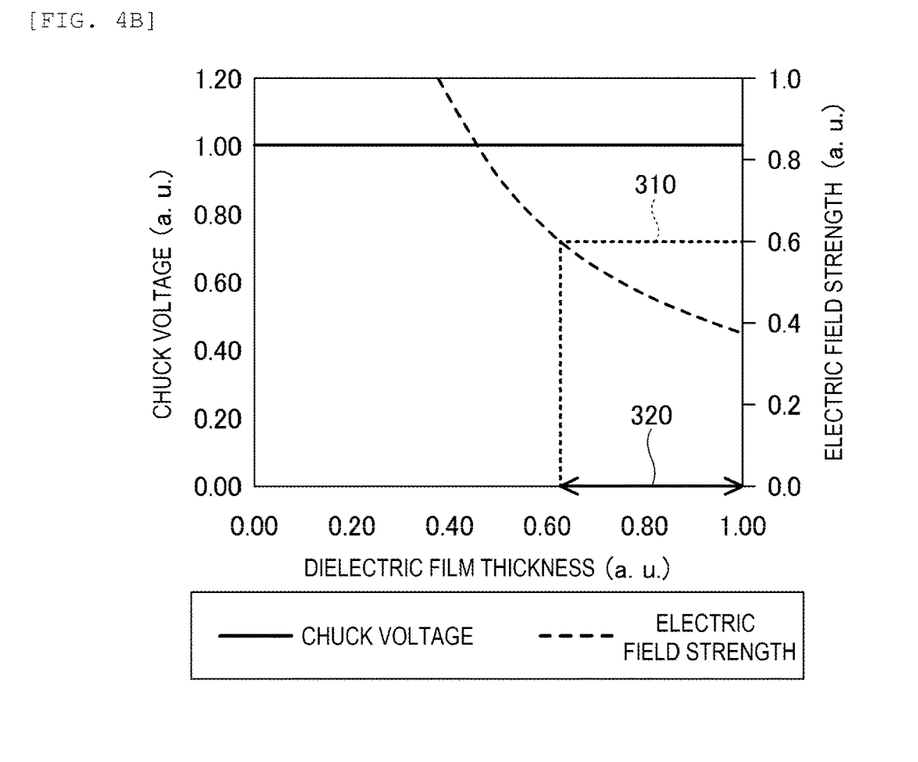

Next, the chuck voltage $V_{HV}$ applied to the electrostatic electrode 1111b of the electrostatic chuck 1111 will be described with reference to FIGS. 3A, 3B, 4A, and 4B. FIG. 3A and FIG. 3B are examples of a graph indicating a method of adjusting the chuck voltage $V_{HV}$ in the present disclosure. FIG. 4A and FIG. 4B are examples of a graph indicating a method of adjusting the chuck voltage $V_{HV}$ in a reference example.

In FIG. 3A and FIG. 4A, a horizontal axis represents a dielectric film thickness (a.u.) of the ceramic member (the dielectric) 1111a from the electrostatic electrode 1111b to the front surface of the electrostatic chuck 1111. A vertical axis on the left side represents an attraction force (a.u.) with which the electrostatic chuck 1111 attracts the substrate W, and is indicated by a solid line in the graph. A vertical axis on the right side represents electric field strength (a.u.), and is indicated by a broken line in the graph.

In FIG. 3B and FIG. 4B, a horizontal axis represents the dielectric film thickness (a.u.) of the ceramic member (the dielectric) 1111a from the electrostatic electrode 1111b to the front surface of the electrostatic chuck 1111. A vertical axis on the left side represents the chuck voltage $V_{HV}$ (a.u.) that is applied to the electrostatic electrode 1111b, and is indicated by a solid line in the graph. A vertical axis on the right side represents electric field strength (a.u.), and is indicated by a broken line in the graph.

Here, in the method of adjusting the chuck voltage $V_{HV}$ in the reference example indicated in FIG. 4A and FIG. 4B, the chuck voltage $V_{HV}$ is controlled to be constant regardless of the dielectric film thickness, as indicated in FIG. 4B. That is, the same chuck voltage $V_{HV}$ is used before and after the electrostatic chuck 1111 is restored.

In this case, as indicated in FIG. 4A, when the electrostatic chuck 1111 is restored and the dielectric film thickness is reduced, the attraction force increases. Further, when the dielectric film thickness is reduced, the electric field strength rapidly increases, and dielectric breakdown easily occurs.

In FIG. 4A and FIG. 4B, a range of dielectric film thickness indicated by an arrow 320 is a range of a film thickness with which the electrostatic chuck 1111 is grindable with respect to electric field strength 310 (here, 0.6) that causes dielectric breakdown. In this way, in the method of adjusting the chuck voltage $V_{HV}$ in the reference example indicated in FIG. 4A and FIG. 4B, the range of the film thickness with which the electrostatic chuck 1111 is grindable is small. In other words, the number of times the electrostatic chuck 1111 can be restored is small.

Therefore, in the method of adjusting the chuck voltage $V_{HV}$ in the reference example indicated in FIG. 4A and FIG. 4B, the number of times the electrostatic chuck 1111 is restored is limited to, for example, about once to twice because a failure in a withstand voltage of the electrostatic chuck 1111 is likely to occur. Further, an attraction pressure increases, so that the temperature of the substrate decreases and the etching characteristics change.

In the method of adjusting the chuck voltage $V_{HV}$ in the present disclosure indicated in FIG. 3A and FIG. 3B, the chuck voltage $V_{HV}$ is controlled such that the attraction force becomes constant regardless of the dielectric film thickness, as indicated in FIG. 3A. Therefore, as indicated in FIG. 3B, the control is performed such that the chuck voltage $V_{HV}$ decreases as the dielectric film thickness decreases. That is, different chuck voltages $V_{HV}$ are used before and after the electrostatic chuck 1111 is restored. Further, control is performed such that the chuck voltage $V_{HV}$ (a second voltage) after restoration of the electrostatic chuck 1111 is smaller than a chuck voltage (a first voltage) before restoration of the electrostatic chuck 1111.

In FIG. 3A and FIG. 3B, a range of the dielectric film thickness indicated by the arrow 320 is a range of a film thickness with which the electrostatic chuck 1111 is grindable with respect to the electric field strength 310 (here, 0.6) that causes dielectric breakdown. In this way, in the method of adjusting the chuck voltage $V_{HV}$ in the present disclosure indicated in FIG. 3A and FIG. 3B, the range of the film thickness with which the electrostatic chuck 1111 is grindable can be expanded. In other words, the number of times the electrostatic chuck 1111 can be restored can be increased.

Further, in the method of adjusting the chuck voltage $V_{HV}$ in the present disclosure indicated in FIG. 3A and FIG. 3B, it is possible to prevent a failure in the withstand voltage of the electrostatic chuck 1111 and increase the number of times the electrostatic chuck 1111 is restored. Further, because the attraction pressure can be made constant, it is possible to reduce a decrease in the temperature of the substrate and to reduce changes in the etching characteristics.

[Method of Operating Electrostatic Chuck 1111]

Figure 5:
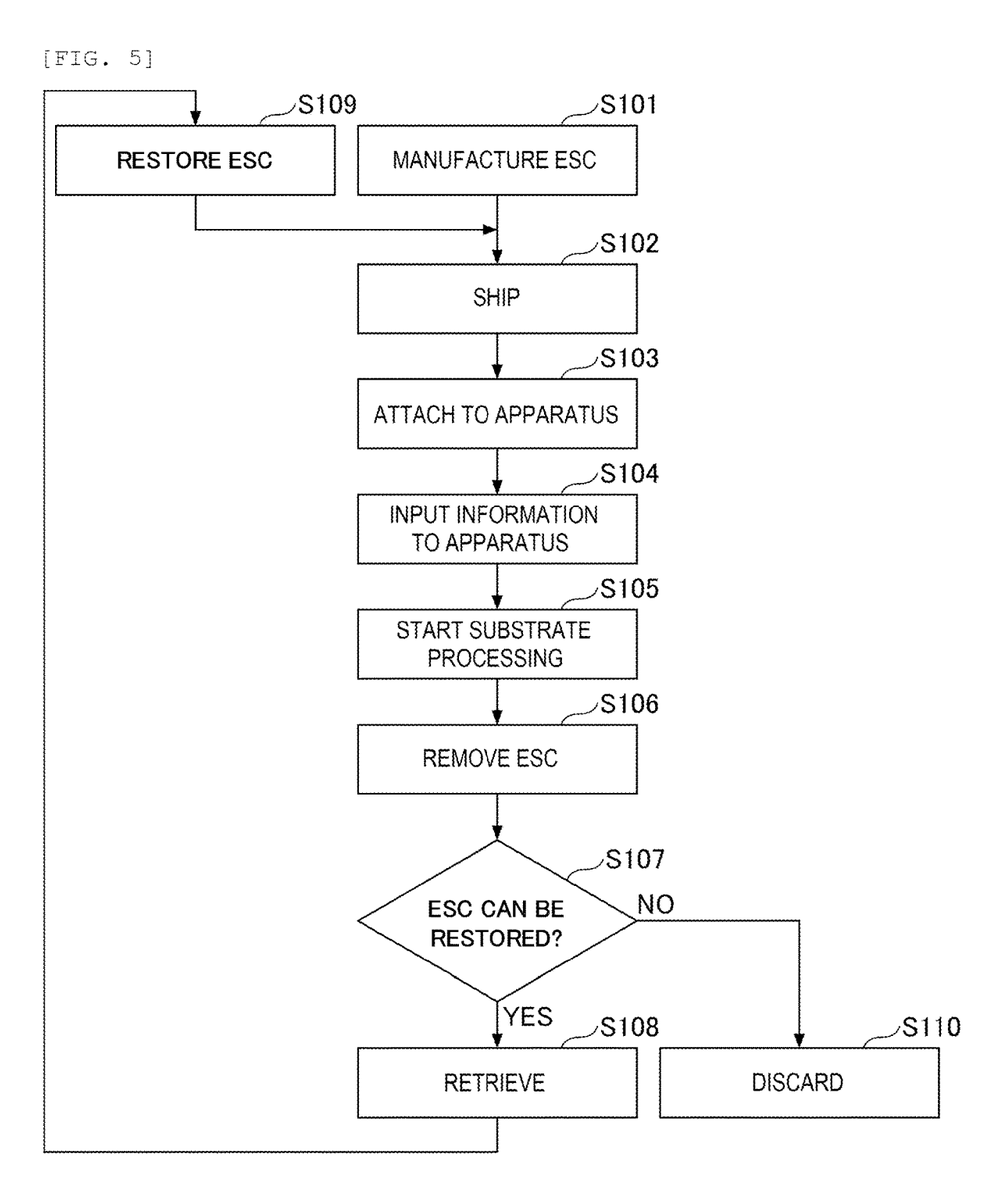
FIG. 5 is an example of a flowchart illustrating a method of operating the electrostatic chuck.

Next, a method of operating the electrostatic chuck 1111 will be described with reference to FIG. 5. FIG. 5 is an example of a flowchart illustrating the method of operating the electrostatic chuck 1111.

In step S101, the electrostatic chuck 1111 as a new product is manufactured. First, a front surface of the ceramic member 1111a including the electrostatic electrode 1111b therein is ground to form a flat surface. Here, as a value of a dielectric thickness of the electrostatic chuck 1111, the film thickness of the ceramic member 1111a (the dielectric) from the electrostatic electrode 1111b to the upper surface (the flat surface) of the ceramic member 1111a is measured at a plurality of locations, and an average film thickness $t_{ave\_i}$ that is an average value thereof is calculated. The measurement location may be one location. Next, by removing a portion of the front surface of the ceramic member 1111a to form the recess portion 1111d, the projection portions 1111c are formed in portions that are not removed. Here, a height of the formed projection portions 1111c is defined as a dot height $t_{dot}$.

In step S102, the electrostatic chuck 1111 is shipped. Here, the electrostatic chuck 1111 as the new product manufactured in step S101 is shipped. Further, when the electrostatic chuck 1111 is shipped, the electrostatic chuck 1111 is shipped including at least information on the average film thickness $t_{ave\_i}$.

In step S103, the electrostatic chuck 1111 is loaded into and attached to the plasma processing chamber 10 (a first chamber) of the plasma processing apparatus 1. Here, the electrostatic chuck 1111 as the new product manufactured in step S101 is attached to the plasma processing chamber 10 (the first chamber) of the plasma processing apparatus 1.

In step S104, information on the attached electrostatic chuck 1111 is input into the computer 2a of the controller 2. The input information is stored in the storage unit 2a2.

Figure 6:
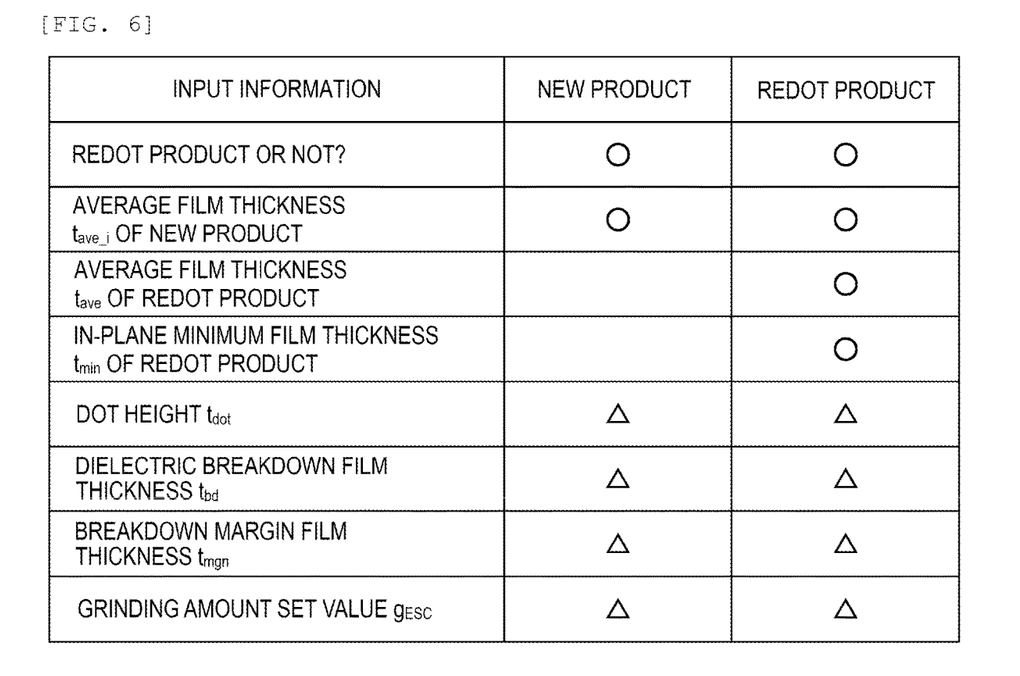
FIG. 6 is an example of a diagram illustrating information input to a controller that controls the plasma processing apparatus.

FIG. 6 is an example of information input to the controller 2 (the computer 2a) that controls the plasma processing apparatus 1. Circles indicate information input when the electrostatic chuck 1111 is attached to the plasma processing apparatus 1. Triangle marks are information that is input to the controller 2 (the computer 2a) in advance.

Here, the information on the electrostatic chuck 1111 as the new product attached to the plasma processing apparatus 1 is input to the computer 2a of the controller 2. Specifically, as indicated in a column of new product in FIG. 6, "information indicating redot product or not" and "average film thickness $t_{ave\_i}$ of new product" are input.

As the information indicating redot product or not, information indicating whether the attached electrostatic chuck 1111 is a redot product or a new product is input. In this step, information indicating that the product is a new product (not a redot product) is input.

The average film thickness $t_{ave\_i}$ of the attached electrostatic chuck 1111 at the time of manufacture (at the time of being the new product) is input as the average film thickness $t_{ave\_i}$ of the new product. In this step, the average film thickness $t_{ave\_i}$ measured in step S101 is input.

Further, "dot height $t_{dot}$", "dielectric breakdown film thickness $t_{bd}$", "breakdown margin film thickness $t_{mgn}$", and "grinding amount set value $g_{ESC}$" are input in advance to the computer 2a.

The dot height $t_{dot}$ is a height of the projection portions 1111c formed on the front surface of the electrostatic chuck 1111 as the new product manufactured in step S101. Further, the dot height $t_{dot}$ is also a height of the projection portions 1111c formed on the front surface of the electrostatic chuck 1111 as a redot product restored in step S109 to be described later.

The dielectric breakdown film thickness $t_{bd}$ is a film thickness (the film thickness of the dielectric from the electrostatic electrode 1111b to the front surface of the ceramic member 1111a) at which dielectric breakdown occurs in the ceramic member 1111a. The breakdown margin film thickness $t_{mgn}$ is a margin for preventing dielectric breakdown of the dielectric from the electrostatic electrode 1111b to the front surface of the ceramic member 1111a. The dielectric breakdown film thickness $t_{bd}$ and the breakdown margin film thickness $t_{mgn}$ are set based on, for example, physical properties of the ceramic member 1111a.

The grinding amount set value $g_{ESC}$ is a grinding amount in a depth direction used when the front surface of the electrostatic chuck 1111 is ground to form a flat surface when the electrostatic chuck 1111 is restored (see (c) of FIG. 2) in step S109 to be described later.

Referring back to FIG. 5, in step S105, processing of the substrate W is started. Here, the electrostatic chuck 1111 as the new product is attached to the plasma processing chamber 10 (the first chamber) of the plasma processing apparatus 1. First, the substrate W (a first substrate) having a pattern formed on a front surface is loaded into the plasma processing chamber 10 (the first chamber) and disposed on the substrate support surface of the electrostatic chuck 1111. The controller 2 applies a chuck voltage $V_{HVi}$ (the first voltage) set in a recipe to the electrostatic electrode 1111b to attract the substrate W (the first substrate). Then, the substrate W is subjected to the plasma processing (first plasma processing) using the plasma processing apparatus 1. When the processing of the substrate W is completed, the attraction is released, and the substrate W (the first substrate) is unloaded from the plasma processing chamber 10 (the first chamber). When such substrate processing is performed a plurality of times and a timing for performing maintenance of the electrostatic chuck 1111 is reached, the processing proceeds to step 106.

In step S106, the electrostatic chuck 1111 is removed from the plasma processing apparatus 1. Here, the electrostatic chuck 1111 is removed from the plasma processing chamber 10 (the first chamber) of the plasma processing apparatus 1 and unloaded.

In step S107, the controller 2 (the processor 2a1) determines whether the electrostatic chuck 1111 can be restored (whether the electrostatic chuck 1111 is restorable). Here, if an in-plane minimum film thickness $t_{min}$ of the electrostatic chuck 1111 satisfies a condition of a formula (1) below, it is determined that the electrostatic chuck 1111 can be restored (S107, YES). Here, the in-plane minimum film thickness $t_{min}$ of the electrostatic chuck 1111 that has never been restored may be set to "$t_{min}=t_{ave\_i}$", or the smallest measured value among a plurality of measured values used when calculating $t_{ave\_i}$ may be used.

$$t_{min} \geq t_{bd} + t_{mgn} + g_{ESC} \qquad (1)$$

If it is determined that the electrostatic chuck 1111 can be restored (S107, YES), the controller 2 may display, on the display unit 2a4, a message indicating that the electrostatic chuck 1111 removed can be restored as a result of the determination. A flow illustrating an operation of the electrostatic chuck 1111 proceeds to step S108.

In step S108, the electrostatic chuck 1111 is retrieved.

In step S109, the retrieved electrostatic chuck 1111 is restored (redotted). First, as illustrated in (c) of FIG. 2, the front surface of the ceramic member 1111a is ground with the grinding amount set value $g_{ESC}$ to form a flat surface. Here, the film thickness of the ceramic member 1111a (the dielectric) from the electrostatic electrode 1111b to the upper surface (the flat surface) of the ceramic member 1111a is measured at a plurality of locations, and an average film thickness $t_{ave}$ of the redot product that is an average value thereof is calculated. Among these measured values, the smallest measured value is defined as the in-plane minimum film thickness $t_{min}$. The measurement location may be one location, and in this case, the measured value may be $t_{ave}$ and $t_{min}$. Next, as illustrated in (d) of FIG. 2, by grinding the front surface of the ceramic member 1111a to form the recess portion 1111d, the projection portions 1111c are formed in portions that are not ground. Here, a height of the formed projection portions 1111c is the dot height toot. In other words, the dot height toot corresponds to a grinding depth of the recess portion 1111d. The flow illustrating the operation of the electrostatic chuck 1111 proceeds to step S102.

When the restored electrostatic chuck 1111 satisfies a condition of "$t_{min}<t_{bd}+t_{mgn}$", it may be determined that the electrostatic chuck 1111 cannot be used. In this case, the electrostatic chuck 1111 may be discarded without being shipped.

In step S102, the electrostatic chuck 1111 is shipped. Here, the electrostatic chuck 1111 as the redot product restored in step S109 is shipped. Further, when the electrostatic chuck 1111 is shipped, the electrostatic chuck 1111 is shipped including at least the information on the average film thickness $t_{ave\_i}$ at the time of being the new product, information on the average film thickness $t_{ave}$ of the redot product, and information on the in-plane minimum film thickness $t_{min}$ of the redot product.

In step S103, the electrostatic chuck 1111 is attached to the plasma processing chamber 10 (a second chamber) of the plasma processing apparatus 1. Here, the electrostatic chuck 1111 as the redot product restored in step S109 is loaded into and attached to the plasma processing chamber 10 (the second chamber) of the plasma processing apparatus 1. The plasma processing chamber 10 (the first chamber) to which the electrostatic chuck 1111 before restoration is attached and the plasma processing chamber 10 (the second chamber) to which the electrostatic chuck 1111 after restoration is attached may be the same plasma processing chamber 10 or different plasma processing chambers 10.

In step S104, the information on the attached electrostatic chuck 1111 is input into the computer 2*a* of the controller 2.

Here, the information on the electrostatic chuck 1111 as the redot product attached to the plasma processing apparatus 1 is input to the computer 2*a* of the controller 2. Specifically, as indicated in a column of redot product in FIG. 6, "information indicating redot product or not", "average film thickness $t_{ave\_i}$ of new product", "average film thickness $t_{ave}$ of redot product", and "in-plane minimum film thickness $t_{min}$ of redot product" are input. The input information is stored in the storage unit 2*a*2.

As the information indicating redot product or not, information indicating whether the attached electrostatic chuck 1111 is a redot product or a new product is input. In this step, information indicating that the product is a redot product is input.

The average film thickness $t_{ave\_i}$ of the attached electrostatic chuck 1111 at the time of manufacture (at the time of being the new product) is input as the average film thickness $t_{ave\_i}$ of the new product. In this step, the average film thickness $t_{ave\_i}$ measured in step S101 is input.

The average film thickness $t_{ave}$ of the attached electrostatic chuck 1111 after restoration is input as the average film thickness $t_{ave}$ of the redot product. In this step, the average film thickness $t_{ave}$ measured in step S109 is input.

The in-plane minimum film thickness $t_{min}$ of the attached electrostatic chuck 1111 after restoration is input as the in-plane minimum film thickness $t_{min}$ of the redot product. In this step, the in-plane minimum film thickness $t_{min}$ measured in step S109 is input.

When a condition of "$t_{min} < t_{bd} + t_{mgn} + g_{ESC}$" is satisfied in the attached electrostatic chuck 1111, the controller 2 (the processor 2*a*1) may determine that the electrostatic chuck 1111 cannot be restored. In this case, the display unit 2*a*4 may display a message indicating that the attached electrostatic chuck 1111 cannot be restored.

Further, in this step, the controller 2 (the processor 2*a*1) calculates the chuck voltage $V_{HV}$ (the second voltage) in second plasma processing to be described later, using these input parameters. The calculated chuck voltage $V_{HV}$ (the second voltage) is stored in the storage unit 2*a*2 as the chuck voltage $V_{HV}$ (the second voltage) in the second plasma processing. The calculated chuck voltage $V_{HV}$ (the second voltage) may be displayed on the display unit 2*a*4.

Referring back to FIG. 5, in step S105, processing of the substrate W is started. Here, the electrostatic chuck 1111 as the redot product is attached to the plasma processing chamber 10 (the second chamber) of the plasma processing apparatus 1. First, the substrate W (a second substrate) having a pattern formed on a front surface is loaded into the plasma processing chamber 10 (the second chamber) and disposed on the substrate support surface of the electrostatic chuck 1111. The first substrate W and the second substrate W are different substrates W. The controller 2 controls the chuck voltage $V_{HV}$ (the second voltage) such that the attraction force by which the electrostatic chuck 1111 attracts the substrate W becomes constant (see FIG. 3A and FIG. 3B). Here, compared with the electrostatic chuck 1111 before restoration, the electrostatic chuck 1111 after restoration has a smaller dielectric film thickness. Therefore, the chuck voltage $V_{HV}$ (the second voltage) smaller than the chuck voltage $V_{HV}$ (the first voltage) in the electrostatic chuck 1111 before restoration is applied. Specifically, the chuck voltage $V_{HV}$ (the second voltage) described below is applied to the electrostatic electrode 1111*b* to attract the substrate W (the second substrate). $\varepsilon_r$ is relative permittivity of the ceramic member 1111*a*, and $V_{HV\_i}$ is the chuck voltage $V_{HV}$ (the first voltage) in the electrostatic chuck 1111 before restoration.

$$\frac{(t_{ave} - t_{dot}) + \varepsilon_r \cdot t_{dot}}{(t_{ave\_i} - t_{dot}) + \varepsilon_r \cdot t_{dot}} \cdot V_{HV\_i} \qquad \text{[Equation 1]}$$

The substrate W is subjected to the plasma processing (the second plasma processing) using the plasma processing apparatus 1. When the processing of the substrate W is completed, the attraction is released, and the substrate W (the second substrate) is unloaded from the plasma processing chamber 10 (the second chamber). When such substrate processing is performed a plurality of times and a timing for performing maintenance of the electrostatic chuck 1111 is reached, the processing proceeds to step S106.

The first plasma processing performed in the first chamber (the plasma processing chamber 10) and the second plasma processing performed in the second chamber (the plasma processing chamber 10) are the same processing (for example, etching process) and are performed with the same processing parameters (except for the chuck voltage $V_{HV}$). That is, the first plasma processing and the second plasma processing are performed under the same conditions such as the type of gas to be supplied, the gas flow rate, the bias voltage, and the processing time. In other words, the processing is performed with the same recipe except for the chuck voltage $V_{HV}$. The first plasma processing and the second plasma processing may be different processing (or the same processing with different processing parameters).

In step S106, the electrostatic chuck 1111 is removed from the plasma processing apparatus 1. Here, the electrostatic chuck 1111 is removed from the plasma processing chamber 10 (the second chamber) of the plasma processing apparatus 1 and unloaded.

In step S107, the controller 2 (the processor 2*a*1) determines whether the electrostatic chuck 1111 can be restored. If it is determined that the electrostatic chuck 1111 can be restored (S107, YES), the flow illustrating the operation of the electrostatic chuck 1111 proceeds to step S108 and step S109, and the electrostatic chuck 1111 is restored (redotted) again. The restored electrostatic chuck 1111 is subjected to the processing illustrated in steps S102 to S106.

If the condition in formula (1) is not satisfied, that is, "$t_{min} < t_{bd} + t_{mgn} + g_{ESC}$", it is determined that the electrostatic chuck 1111 cannot be restored (S107, NO). In this case, the controller 2 may display, on the display unit 2*a*4, a message indicating that the removed electrostatic chuck 1111 cannot be restored. The flow illustrating the operation of the electrostatic chuck 1111 proceeds to step S110.

In step S110, the electrostatic chuck 1111 is discarded.

According to one aspect of the present disclosure, the chuck voltage $V_{HV}$ is controlled such that the attraction force for the substrate W becomes constant before and after the front surface of the electrostatic chuck 1111 is ground. Accordingly, the plurality of substrates W can be processed uniformly.

Further, after the front surface grinding, the chuck voltage $V_{HV}$ applied to the electrostatic chuck 1111, in which the thickness of the ceramic member 1111*a* (the dielectric) becomes smaller, is reduced. Accordingly, dielectric breakdown of the electrostatic chuck 1111 is less likely to occur, and the number of times the electrostatic chuck 1111 can be restored (redotted) (the number of times the electrostatic chuck 1111 can be ground) can be increased.

The unloading (see S106) and the disposing (see S103) of the electrostatic chuck 1111 may be manually performed by an operator while opening the plasma processing chamber 10, or may be automatically performed by a transfer arm provided in a vacuum transfer chamber provided adjacent to the plasma processing chamber 10.

Further, in the example described above, an example in which the thickness of the dielectric becomes smaller by the front surface grinding accompanying restoration of the electrostatic chuck 1111 is described. However, the present disclosure is not limited thereto. The electrostatic chuck 1111 is worn by, for example, waferless dry cleaning or contact with the rear surface of the substrate W.

Therefore, control over the chuck voltage in the present disclosure may be applied before the electrostatic chuck 1111 is restored. This method of operating the electrostatic chuck 1111 will be described with reference to FIG. 7.

Figure 7:
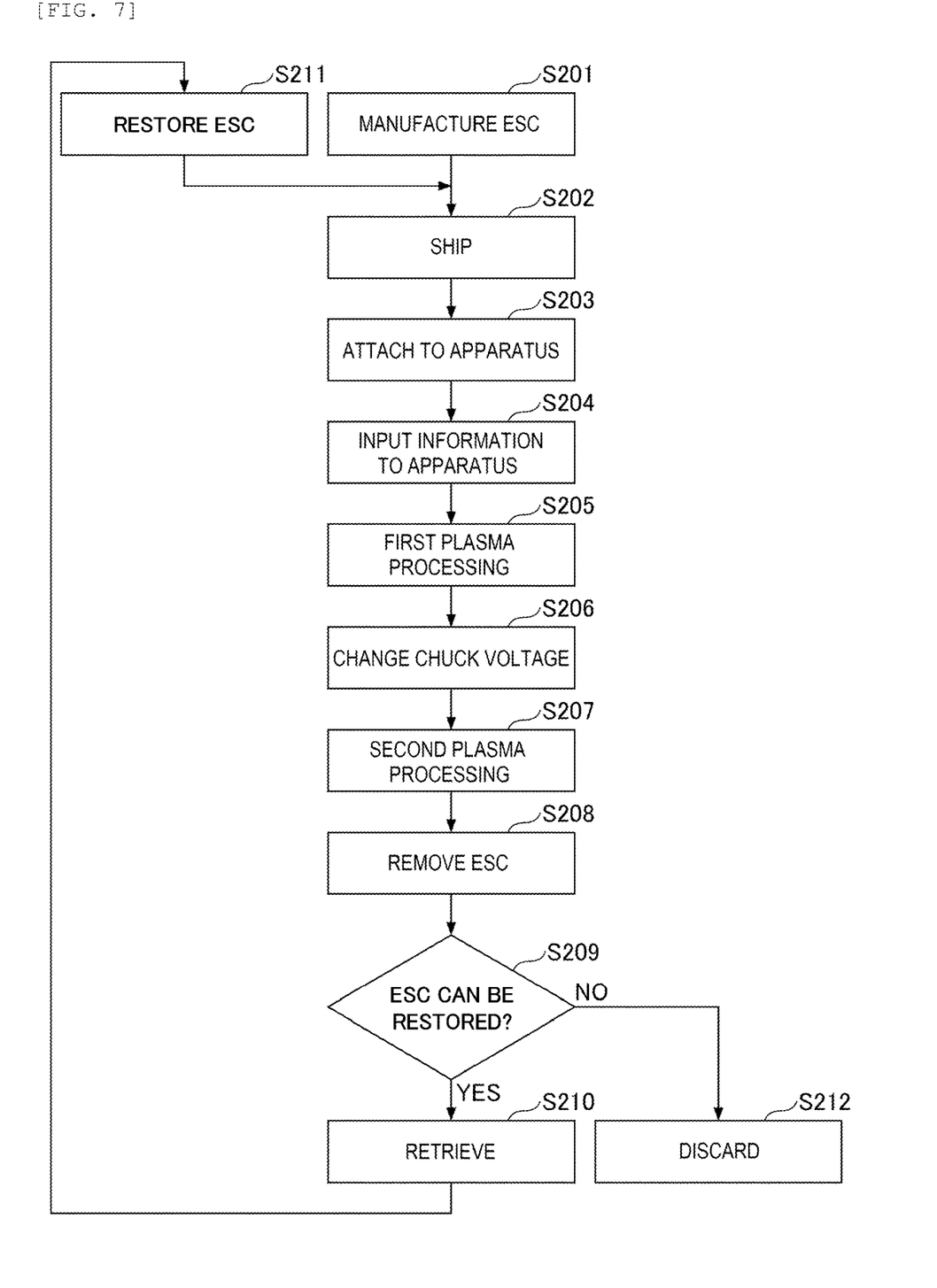
FIG. 7 is another example of the flowchart illustrating the method of operating the electrostatic chuck.

FIG. 7 is another example of a flowchart illustrating the method of operating the electrostatic chuck 1111. Processing from step S201 to step S204 is substantially the same as the processing from step S101 to step S104 illustrated in FIG. 5.

In step S205, plasma processing (first plasma processing) is performed a plurality of times on a plurality of substrates W (the first substrates). In the first plasma processing, the chuck voltage $V_{HV_i}$ (the first voltage) is applied to the electrostatic electrode 1111*b* to attract the substrate W (the first substrate). When the number of processed substrates W or an integration processing time exceeds a predetermined value, the processing proceeds to step S206.

In step S206, a set value of the chuck voltage is changed from the $V_{HV\_i}$ (the first voltage) to the chuck voltage $V_{HV}$ (the second voltage). The storage unit 2*a*2 stores a table indicating a wear amount of the dielectric according to the number of processed substrates W or the integration processing time. The processor 2*a*1 estimates the present average film thickness $t_{ave}$ and dot height toot based on the wear amount, and calculates the chuck voltage $V_{HV}$ (the second voltage). The chuck voltage $V_{HV}$ (the second voltage) calculated by the processor 2*a*1 is stored in the storage unit 2*a*2.

In step S207, plasma processing (second plasma processing) is performed a plurality of times on a plurality of substrates W (the second substrates). In the second plasma processing, the chuck voltage $V_{HV}$ (the second voltage) is applied to the electrostatic electrode 1111*b* to attract the substrate W (the second substrate). The first plasma processing and the second plasma processing are performed with the same processing parameters (except for the chuck voltage $V_{HV}$). The first plasma processing and the second plasma processing may be performed with different processing parameters. When the number of processed substrates W or the integration processing time exceeds a predetermined value, it is determined that the timing for performing maintenance is reached, and the processing proceeds to step S208.

In the example illustrated in FIG. 7, the processing proceeds to step S208 after the second plasma processing. However, the present disclosure is not limited thereto. After the second plasma processing, the processing may return to step S206 to change again (reset) the chuck voltage. Then, a plurality of substrates W (third substrates) may be subjected to plasma processing (third plasma processing) a plurality of times with the changed chuck voltage. Similarly, the change in the chuck voltage and the plasma processing using the changed chuck voltage may be repeated until it is determined that the timing for performing the maintenance is reached.

Processing from step S208 to step S212 is substantially the same as the processing from step S106 to step S110 illustrated in FIG. 5.

Further, the electrostatic chuck 1111 is described using the electrostatic chuck 1111 that holds the substrate W as an example. However, the present disclosure is not limited to this. The processing may be performed on an electrostatic chuck that holds an edge ring disposed around the substrate W.

Figure 8:
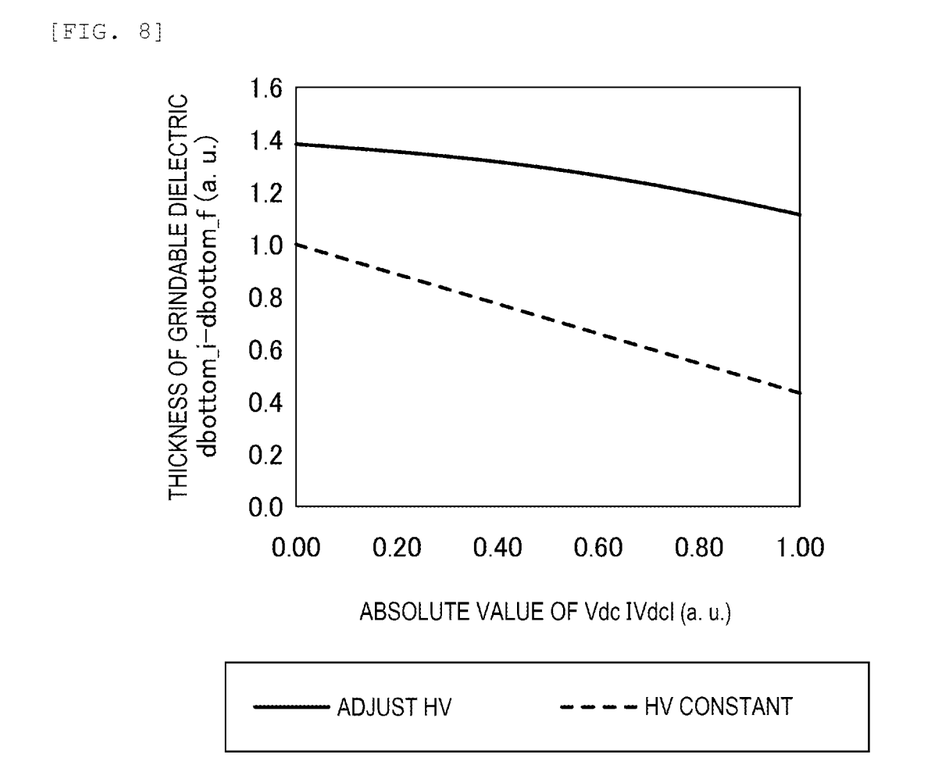
FIG. 8 is an example of a graph indicating a relationship between a bias voltage and a thickness of a dielectric with which the dielectric is grindable.

FIG. 8 is an example of a graph indicating a relationship between a bias voltage Vdc and the thickness with which the dielectric is grindable. A horizontal axis represents an absolute value of the bias voltage Vdc, |Vdc|. A vertical axis represents the thickness with which the dielectric is grindable. Further, a case of the method of adjusting the chuck voltage $V_{HV}$ in the present disclosure indicated in FIG. 3A and FIG. 3B is indicated by a solid line. A case of the method of adjusting the chuck voltage $V_{HV}$ in the reference example indicated in FIG. 4A and FIG. 4B is indicated by a broken line.

As indicated in FIG. 8, according to the method of adjusting the chuck voltage $V_{HV}$ in the present disclosure indicated in FIG. 3A and FIG. 3B, the thickness with which the dielectric is grindable can be increased compared with the method of adjusting the chuck voltage $V_{HV}$ in the reference example indicated in FIG. 4A and FIG. 4B. That is, the number of times the electrostatic chuck 1111 is restored can be increased.

The embodiments disclosed above include, for example, the following aspects.

(Appendix 1)

A substrate holding method including:
loading a first substrate into a first chamber and placing the first substrate on an electrostatic chuck disposed in the first chamber;
applying a first voltage to an electrostatic electrode of the electrostatic chuck to attract the first substrate to the electrostatic chuck;
unloading the electrostatic chuck from the first chamber;
grinding a front surface of the electrostatic chuck;
disposing the electrostatic chuck in a second chamber;
loading a second substrate into the second chamber and placing the second substrate on the electrostatic chuck disposed in the second chamber; and
applying a second voltage smaller than the first voltage to the electrostatic electrode of the electrostatic chuck to attract the second substrate to the electrostatic chuck.

(Appendix 2)

The substrate holding method according to appendix 1, further including:

after the attracting of the first substrate to the electrostatic chuck yet before the unloading of the electrostatic chuck from the first chamber, performing first substrate processing on the first substrate in the first chamber, and after the attracting of the second substrate to the electrostatic chuck yet before the unloading of the electrostatic chuck from the second chamber, performing second substrate processing on the second substrate in the second chamber.

(Appendix 3)

The substrate holding method according to appendix 2, in which the first substrate processing and the second substrate processing are performed with processing parameters that are same except for a voltage that is applied to the electrostatic electrode of the electrostatic chuck.

(Appendix 4)

The substrate holding method according to any one of appendixes 1 to 3, in which the first chamber is same as the second chamber.

(Appendix 5)

The substrate holding method according to any one of appendixes 1 to 3, in which the first chamber is a chamber different from the second chamber.

(Appendix 6)

The substrate holding method according to any one of appendixes 1 to 5, further including:

before the grinding of the front surface of the electrostatic chuck, determining whether the electrostatic chuck is restorable.

(Appendix 7)

The substrate holding method according to any one of appendixes 1 to 6, further including before the attracting of the second substrate to the electrostatic chuck, calculating a value of the second voltage by using a value of the first voltage and a value of a thickness of a dielectric of the electrostatic chuck disposed in the second chamber.

(Appendix 8)

A plasma processing apparatus including:

a plasma processing chamber, an electrostatic chuck disposed in the plasma processing chamber and including an electrostatic electrode, a power source configured to apply a voltage to the electrostatic electrode, and a controller configured to control the power source, the controller being configured to apply a first voltage to the electrostatic electrode of the electrostatic chuck before grinding to attract a first substrate to the electrostatic chuck, and the controller being configured to apply a second voltage smaller than the first voltage to the electrostatic electrode of the electrostatic chuck after grinding to attract a second substrate to the electrostatic chuck.

(Appendix 9)

The plasma processing apparatus according to appendix 8, in which the controller includes a storage unit configured to store a value of the first voltage and a value of a thickness of a dielectric of the electrostatic chuck, and a processor configured to calculate a value of the second voltage by using the value of the first voltage and the value of the thickness of the dielectric.

(Appendix 10)

The plasma processing apparatus according to appendix 9, in which the controller further includes a display unit configured to display the value of the second voltage calculated by the processor.

(Appendix 11)

The plasma processing apparatus according to appendix 10, in which the processor determines whether the electrostatic chuck is restorable, and the display unit displays a result of the determination.

(Appendix 12)

A substrate holding method including:

loading a first substrate into a chamber and placing the first substrate on an electrostatic chuck disposed in the chamber;

applying a first voltage to an electrostatic electrode of the electrostatic chuck to attract the first substrate to the electrostatic chuck;

calculating a second voltage smaller than the first voltage applied to the electrostatic electrode of the electrostatic chuck by using a wear amount of the electrostatic chuck;

loading a second substrate into the chamber and placing the second substrate on the electrostatic chuck disposed in the chamber; and applying the second voltage to the electrostatic electrode of the electrostatic chuck to attract the second substrate to the electrostatic chuck.

The present invention is not limited to the configurations described in connection with the embodiments that have been described heretofore, or to the combinations of these configurations with other elements. Various variations and modifications may be made without departing from the scope of the present invention, and may be adopted according to applications.

According to one aspect, a substrate holding method and a substrate processing apparatus in which a substrate is held with an electrostatic chuck can be provided.

What is claimed is:

1. A substrate holding method comprising:

loading a first substrate into a first chamber and placing the first substrate on an electrostatic chuck disposed in the first chamber;

applying a first voltage to an electrostatic electrode of the electrostatic chuck to attract the first substrate to the electrostatic chuck;

unloading the electrostatic chuck from the first chamber;

grinding a front surface of the electrostatic chuck;

disposing the electrostatic chuck in a second chamber;

loading a second substrate into the second chamber and placing the second substrate on the electrostatic chuck disposed in the second chamber;

applying a second voltage smaller than the first voltage to the electrostatic electrode of the electrostatic chuck to attract the second substrate to the electrostatic chuck; and before the attracting of the second substrate to the electrostatic chuck, calculating a value of the second voltage by using a value of the first voltage and a value of a thickness of a dielectric of the electrostatic chuck disposed in the second chamber.

2. The substrate holding method according to claim 1, further comprising:

after the attracting of the first substrate to the electrostatic chuck yet before the unloading of the electrostatic chuck from the first chamber, performing first substrate processing on the first substrate in the first chamber, and after the attracting of the second substrate to the electrostatic chuck yet before the unloading of the electrostatic chuck from the second chamber, performing second substrate processing on the second substrate in the second chamber.

3. The substrate holding method according to claim 2, wherein
the first substrate processing and the second substrate processing are performed with processing parameters that are same except for a voltage that is applied to the electrostatic electrode of the electrostatic chuck.

4. The substrate holding method according to claim 3, wherein
the first chamber is same as the second chamber.

5. The substrate holding method according to claim 3, wherein
the first chamber is a chamber different from the second chamber.

6. The substrate holding method according to claim 1, further comprising:
before the grinding of the front surface of the electrostatic chuck, determining whether the electrostatic chuck is restorable.

7. A plasma processing apparatus comprising:
a plasma processing chamber;
an electrostatic chuck disposed in the plasma processing chamber and including an electrostatic electrode;
a power source configured to apply a voltage to the electrostatic electrode; and
a controller configured to control the power source, the controller being configured to apply a first voltage to the electrostatic electrode of the electrostatic chuck before grinding to attract a first substrate to the electrostatic chuck, and the controller being configured to apply a second voltage smaller than the first voltage to the electrostatic electrode of the electrostatic chuck after grinding to attract a second substrate to the electrostatic chuck,
wherein the controller includes
a storage unit configured to store a value of the first voltage and a value of a thickness of a dielectric of the electrostatic chuck, and
a processor configured to calculate a value of the second voltage by using the value of the first voltage and the value of the thickness of the dielectric.

8. The plasma processing apparatus according to claim 7, wherein
the controller further includes a display configured to display the value of the second voltage calculated by the processor.

9. The plasma processing apparatus according to claim 8, wherein
the processor determines whether the electrostatic chuck is restorable, and
the display displays a result of the determination.

10. A substrate holding method comprising:
loading a first substrate into a chamber and placing the first substrate on an electrostatic chuck disposed in the chamber;
applying a first voltage to an electrostatic electrode of the electrostatic chuck to attract the first substrate to the electrostatic chuck;
calculating a second voltage smaller than the first voltage applied to the electrostatic electrode of the electrostatic chuck by using a wear amount of the electrostatic chuck, the wear amount being determined based on a number of processed substrates or integration processing time;
loading a second substrate into the chamber and placing the second substrate on the electrostatic chuck disposed in the chamber; and
applying the second voltage to the electrostatic electrode of the electrostatic chuck to attract the second substrate to the electrostatic chuck.

* * * * *